United States Patent
Hwang et al.

(10) Patent No.: US 6,884,731 B2
(45) Date of Patent: Apr. 26, 2005

(54) METHOD FOR FORMING MAGNETIC TUNNELING JUNCTION LAYER FOR MAGNETIC RANDOM ACCESS MEMORY

(75) Inventors: Soon-won Hwang, Suwon-si (KR); I-hun Song, Seongnam-si (KR); Tae-wan Kim, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/765,279

(22) Filed: Jan. 28, 2004

(65) Prior Publication Data

US 2004/0253786 A1 Dec. 16, 2004

(30) Foreign Application Priority Data

Jan. 28, 2003 (KR) .................................. 10-2003-0005484

(51) Int. Cl.[7] ...................... H01L 21/302; H01L 21/461
(52) U.S. Cl. .......................................... 438/709; 438/3
(58) Field of Search .............................. 438/709, 3, 73, 438/710, 712, 729, 732

(56) References Cited

U.S. PATENT DOCUMENTS 6,605,836 B1 * 8/2003 Kishi et al. .................. 257/295
6,806,127 B1 * 10/2004 Butcher et al. ............. 438/197
6,821,907 B1 * 11/2004 Hwang et al. .............. 438/709

* cited by examiner

*Primary Examiner*—David Nhu
(74) *Attorney, Agent, or Firm*—Lee, Sterba, & Morse, P.C.

(57) ABSTRACT

A method of forming a magnetic tunneling junction (MTJ) layer for an MRAM includes sequentially forming a lower material layer, an insulation layer, and an upper material layer on a substrate, forming a mask pattern on a predetermined region of the upper material layer, sequentially removing the upper material layer, the insulation layer, and the lower material layer from around the mask pattern using plasma generated from an etching gas, wherein the etching gas is a mixture of a main gas and an additive gas having a predetermined mixture ratio and including no chlorine ($Cl_2$) gas, and removing the mask pattern. Accordingly, an MTJ layer formed by the method may incur no thermal damage due to high temperature etching, no material deposits due to by-products of etching, and no step difference or corrosion due to chlorine gas, and may have an excellent profile.

16 Claims, 9 Drawing Sheets

METHOD FOR FORMING MAGNETIC TUNNELING JUNCTION LAYER FOR MAGNETIC RANDOM ACCESS MEMORY

BACKGROUND OF THE INVENTION

1. Field of the Invention

The present invention relates to a method of manufacturing a magnetic random access memory (MRAM). More particularly, the present invention relates to a method of forming a magnetic tunnel junction (MTJ) for an MRAM.

2. Description of the Related Art

As shown in FIG. 1, an MRAM generally includes a transistor T serving as a switch and an MTJ layer S on which data having a value of "0" or "1" are recorded. In a conventional method of manufacturing an MRAM, a gate stack 12 including a gate electrode is formed on a semiconductor substrate 10, and then a source region 14 and a drain region 16 are respectively formed at either side of the gate stack 12, thereby completing the transistor T having switch functions shown in FIG. 1. In FIG. 1, reference numeral 11 represents field oxide layers. An interlayer dielectric layer 18 is formed on the semiconductor substrate 10, on which the transistor T has already been formed, to completely cover the transistor T. During the formation of the interlayer dielectric layer 18, a data line 20 is formed over the gate stack 12 to be covered with the interlayer dielectric layer 18 and to be in parallel with the gate stack 12. A contact hole 22, through which the drain region 16 is exposed, is formed in the interlayer dielectric layer 18. The contact hole 22 is filled with a conductive plug 24 having the same height as the interlayer dielectric layer 18, and then a pad conductive layer 26 is formed to contact the top surface of the conductive plug 24 on the interlayer dielectric layer 18. The pad conductive layer 26 is formed over the data line 20. The MTJ layer S is formed on a predetermined area of a top surface of the pad conductive layer 26 that corresponds to the data line 20, and then a second interlayer dielectric layer 28 is formed to cover the MTJ layer S and the pad conductive layer 26. A via hole 30 is formed in the second interlayer dielectric layer 28 so that a top surface of the MTJ layer S is exposed through the via hole 30. A bitline 32 filling the via hole 30 is formed on the second interlayer dielectric layer 28 to be perpendicular to the gate electrode and the data line 20.

A method of forming the MTJ layer S included in the MRAM shown in FIG. 1 will now be described with reference to FIGS. 2 and 3.

As shown in FIG. 2, a lower magnetic layer S1, an insulation layer S2, and an upper magnetic layer S3 are sequentially formed on a predetermined region of the pad conductive layer 26, and then a mask pattern M is formed on the upper magnetic layer S3 to define a place where the MTJ layer S will be formed. Thereafter, as shown in FIG. 3, the upper magnetic layer S3, the insulation layer S2, and the lower magnetic layer S1 are sequentially etched using the mask pattern M as an etching mask, and then the mask pattern M is removed, thus completing the MTJ layer S.

Here, an ion milling method using argon (Ar) gas, a dry etching method using chlorine gas, or a reactive ion etching method may be used to sequentially etch the upper magnetic layer S3, the insulation layer S2, and the lower magnetic layer S1.

The MTJ layer S may be formed using a lift-off process. For example, the MTJ layer S may be formed as follows. First, a photoresist layer pattern is formed on the pad conductive layer 26 so that a region where the MTJ layer S will be formed is exposed, and then the material layers S1 through S3 constituting the MTJ layer S are sequentially deposited on the exposed region. Thereafter, the photoresist layer pattern is removed so that the material layers S1 through S3 formed at regions other than the place where the MTJ layer S will be formed are removed.

The method of manufacturing an MRAM, which has been described above, causes various problems depending on the way the MTJ layer S is formed.

First, in the case of forming the MTJ layer S using an ion milling method, the MTJ layer S can hardly have a delicate pattern, and by-products of an etching process for forming the MTJ layer S may be deposited at either side of the MTJ layer S. As a result of the deposition, an ear-shaped deposit of material 34 is formed at either side of the MTJ layer S, as shown in FIG. 3. The deposited material 34 short-circuits the material layers constituting the MTJ layer S, and accordingly, a tunneling magneto resistance (TMR) and a TMR ratio decrease.

Second, in the case of forming the MTJ layer S by using a reactive ion etching method, an undercut may be generated at either side of the MTJ layer S, and thus a tunnel barrier layer, i.e., the insulation layer S2 interposed between the upper and lower magnetic layers S3 and S1, may be damaged after an etching process due to the defective profile of either side of the MTJ layer S.

Third, in the case of forming the MTJ layer S by performing a dry etching method using chlorine gas as an etching gas, a discontinuous side step difference may be generated between the upper and lower magnetic layers S3 and S1 and the insulation layer S2 after the dry etching process. In particular, the insulation layer S2 may be corroded by the etching gas remaining even after the etching process, thus deteriorating the reproducibility of the dry etching process. Therefore, it is difficult to form an MTJ layer to be smaller than a micro size by using the dry etching method.

Fourth, in the case of forming the MTJ layer S by using a lift-off method, productivity decreases.

SUMMARY OF THE INVENTION

The present invention provides a method of forming an MTJ layer for an MRAM, in which an MTJ layer having a size of 1 micrometer or smaller and a good profile can be formed by preventing by-products of an etching process from being deposited at either side of the MTJ layer after the etching process and by minimizing thermal damage to the MTJ layer.

According to a feature of an embodiment of the present invention, there is provided a method of manufacturing a magnetic tunneling junction (MTJ) layer for a magnetic random access memory (MRAM) including sequentially forming a lower material layer, an insulation layer, and an upper material layer on a substrate, forming a mask pattern on a predetermined region of the upper material layer, sequentially removing the upper material layer, the insulation layer, and the lower material layer from around the mask pattern using plasma generated from an etching gas, wherein the etching gas is a mixture of a main gas and an additive gas having a predetermined mixture ratio and including no chlorine ($Cl_2$) gas, and removing the mask pattern.

Preferably, sequentially removing the upper material layer, the insulation layer, and the lower material layer from around the mask pattern includes loading a resultant structure having the mask pattern formed on the predetermined region of the upper material layer into an inductively coupled plasma etching apparatus, and generating plasma over the resultant structure by uniformly supplying the etching gas into the inductively coupled plasma etching apparatus and applying a predetermined source power and a predetermined bias voltage to the inductively coupled plasma etching apparatus.

Preferably, about 10% to about 40% of the etching gas is comprised of the main gas.

Preferably, the main gas is boron trichloride ($BCl_3$), and the additive gas is argon (Ar).

Preferably, a source power of from about 500 W to about 800 W is applied to the inductively coupled plasma etching apparatus.

Preferably, a bias voltage of from about 100 V to about 150 V is applied to the inductively coupled plasma etching apparatus.

Preferably, the upper material layer, the insulation layer, and the lower material layer are removed from around the mask pattern at a temperature of about 25° C.

Preferably, at least one of the lower material layer and the upper material layer is a single magnetic layer or a multi-layered material layer including at least one magnetic layer.

Preferably, the mask pattern is formed to be smaller than micro size.

Sequentially removing the upper material layer, the insulation layer, and the lower material layer from around the mask pattern may include first removing the upper material layer and the insulation layer from around the mask pattern, and then removing the lower material layer from around the mask pattern. In this case, before removing the lower material layer from around the mask pattern, the etching gas is preferably adjusted to be comprised of from about 10% to about 40% main gas in accordance with etching characteristics of the lower material layer to facilitate etching of the lower material layer.

Alternatively, sequentially removing the upper material layer, the insulation layer, and the lower material layer from around the mask pattern may include first removing the upper material layer from around the mask pattern, then removing the insulation layer from around the mask pattern, and then removing the lower material layer from around the mask pattern. In this case, before removing each of the insulation layer and the lower material layer from around the mask pattern, the etching gas is preferably adjusted to be comprised of from about 10% to about 40% main gas in accordance with etching characteristics of the insulation layer and the lower material layer to facilitate etching of the insulation layer and the lower material layer.

Sequentially removing the upper material layer, the insulation layer, and the lower material layer from around the mask pattern may, however, include first removing the upper material layer from around the mask pattern, and then removing the insulation layer and the lower material layer from around the mask pattern. In this case, before removing the insulation layer and the lower material layer from around the mask pattern, the etching gas is preferably adjusted to be comprised of from about 10% to about 40% main gas in accordance with etching characteristics of the insulation layer and the lower material layer to facilitate etching of the insulation layer and the lower material layer.

Preferably, the substrate is formed by sequentially depositing a titanium layer and a titanium nitride layer.

According to the present invention, an etching process can be performed at a low temperature of about 25° C., or approximately room temperature, thereby preventing thermal damage to an MTJ layer. In addition, by-products of the etching process of the present invention are volatile. Therefore, deposition of by-products at either side of the MTJ layer may be prevented, and thus the MTJ layer can have a good profile. Moreover, because chlorine gas ($Cl_2$) is not used as an etching gas in the present invention, generation of a step difference at either side of the MTJ layer and corrosion of the MTJ layer may be prevented.

BRIEF DESCRIPTION OF THE DRAWINGS

The above features and advantages of the present invention will become more apparent to those of ordinary skill in the art by describing in detail exemplary embodiments thereof with reference to the attached drawings in which.

DETAILED DESCRIPTION OF THE INVENTION

Figure 1:
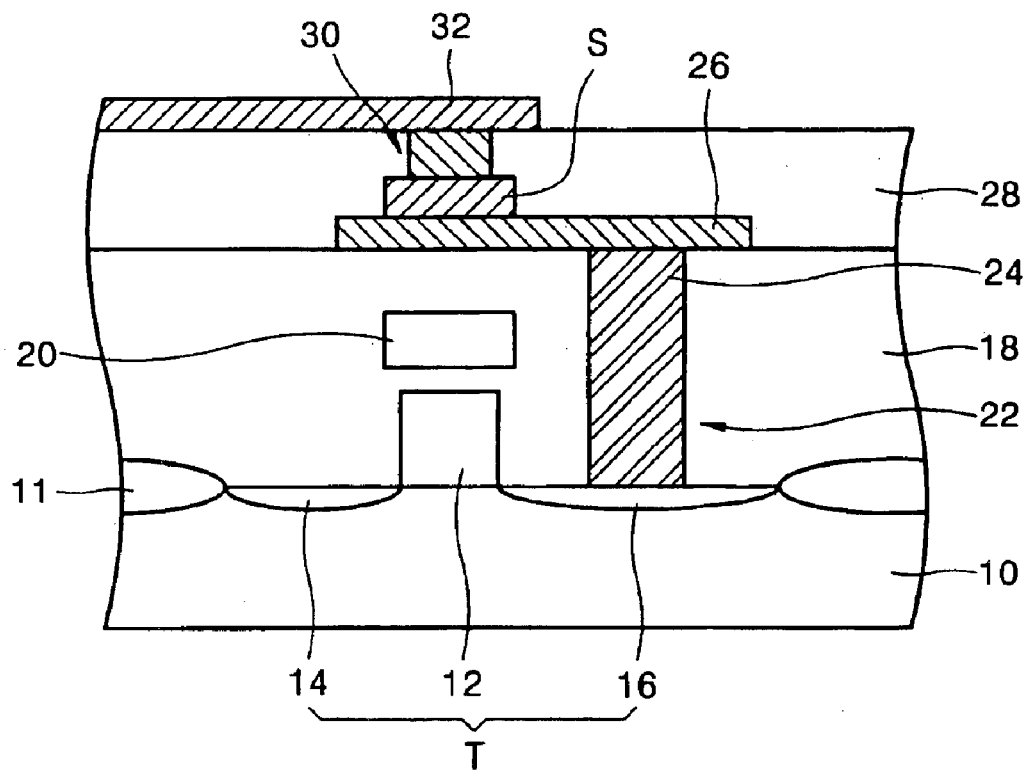
FIG. 1 illustrates a cross-sectional view of a conventional magnetic random access memory (MRAM)
Figure 2:
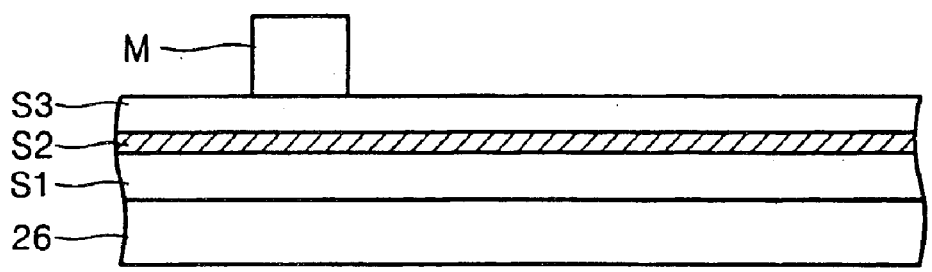
FIGS. 2 and 3 illustrate cross-sectional views of the structure of a magnetic tunneling junction (MTJ) layer of the MRAM shown in FIG. 1 and a conventional method of forming the MTJ layer.

Korean Patent Application No. 2003-5484, filed on Jan. 28, 2003, and entitled: "Method for Forming a Magnetic Tunneling Junction Layer for Magnetic Random Access Memory," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity, and like reference numerals refer to like elements throughout.

Figure 4:
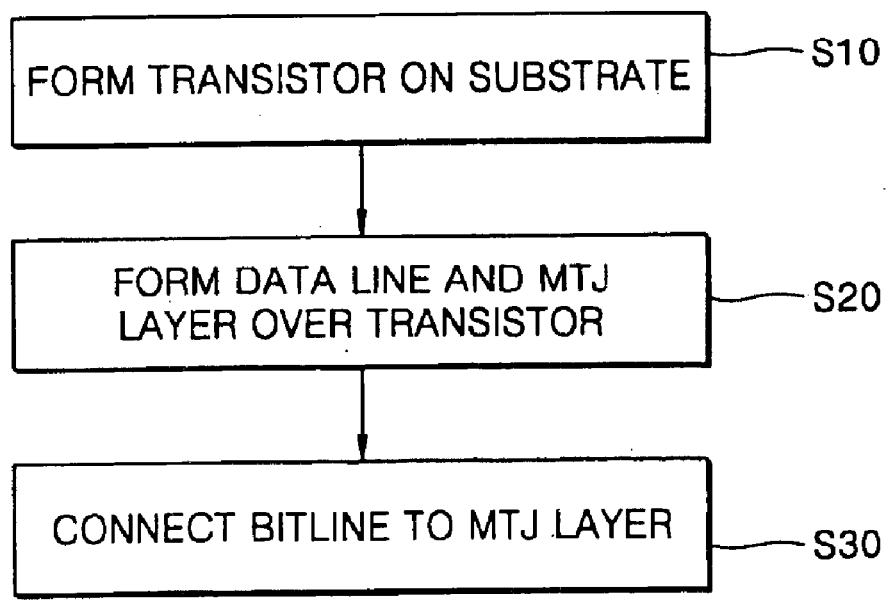
FIG. 4 is a flowchart of a method of manufacturing an MRAM according to a preferred embodiment of the present invention.

A method of forming a magnetic tunnelling junction (MTJ) layer for a magnetic random access memory (MRAM) as shown in FIG. 4 according to a preferred embodiment of the present invention includes forming a transistor on a substrate in step S10, sequentially forming a data line and an MTJ layer over the transistor in step S20 using a predetermined plasma etching process so that the MTJ layer can be connected to the transistor, and forming a bitline to be connected to the MTJ layer in step S30.

Figure 5:
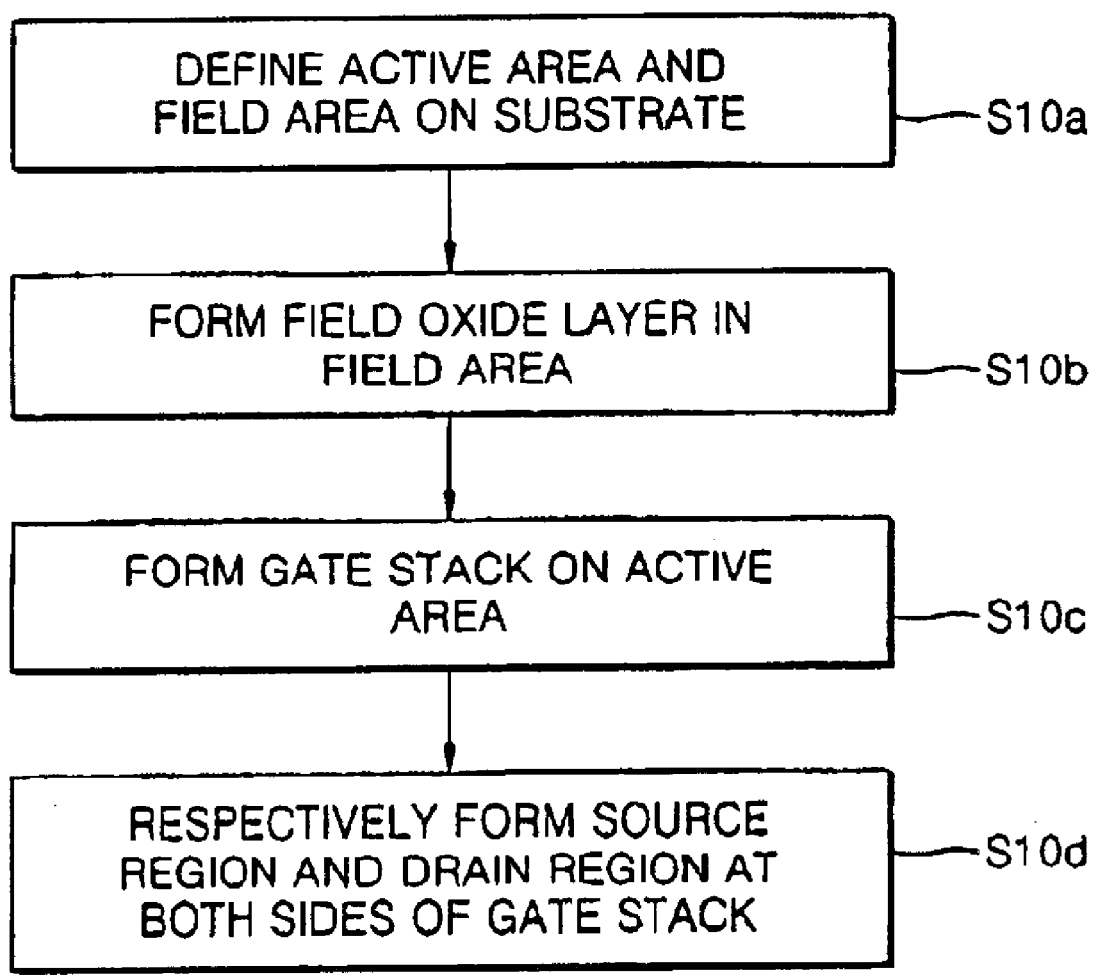
FIGS. 5 through 7 are detailed flowcharts of steps S10, S20, and S30, respectively, of the method of manufacturing an MRAM shown in FIG. 4.

Referring to FIG. 5, step S10 includes defining an active area and a field area on the substrate in step S10a, forming a field oxide layer used for device isolation in the field area in step S10b, forming a gate stack including a gate electrode on the active area of the substrate in step S10c, and respectively forming a source region and a drain region in the active area at either side of the gate stack in step S10d.

Figure 6:
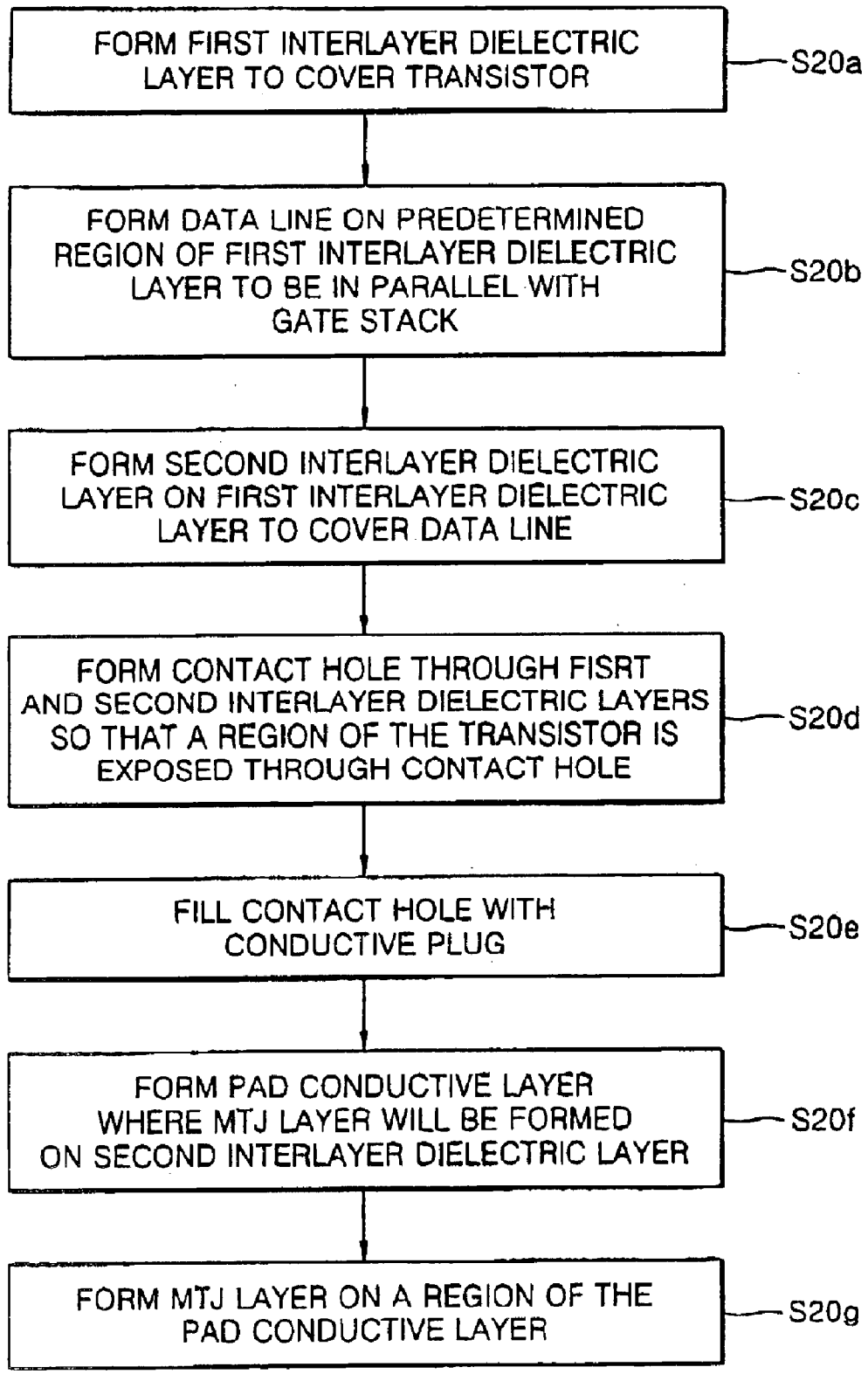

Referring to FIG. 6, step S20 includes forming a first interlayer dielectric layer on the substrate to cover the transistor in step S20a, forming a data line on a predetermined region of the first interlayer dielectric layer, preferably, directly above the gate stack in step S20b so that the data line is in parallel with the gate stack, forming a second interlayer dielectric layer on the first interlayer dielectric layer to cover the data line in step S20c, forming a contact hole through the first and second interlayer dielectric layers, so that a predetermined region of the transistor, for example, the drain region, is exposed in step S20d, filling the contact hole with a conductive plug in step S20e, forming a pad conductive layer on which the MTJ layer will be formed on the second interlayer dielectric layer in step S20f so that the pad conductive layer contacts a top surface of the conductive plug and extends over the data line, and forming the MTJ layer on a region of the pad conductive layer that corresponds to the data line in step S20g by performing a predetermined plasma etching process.

Figure 7:
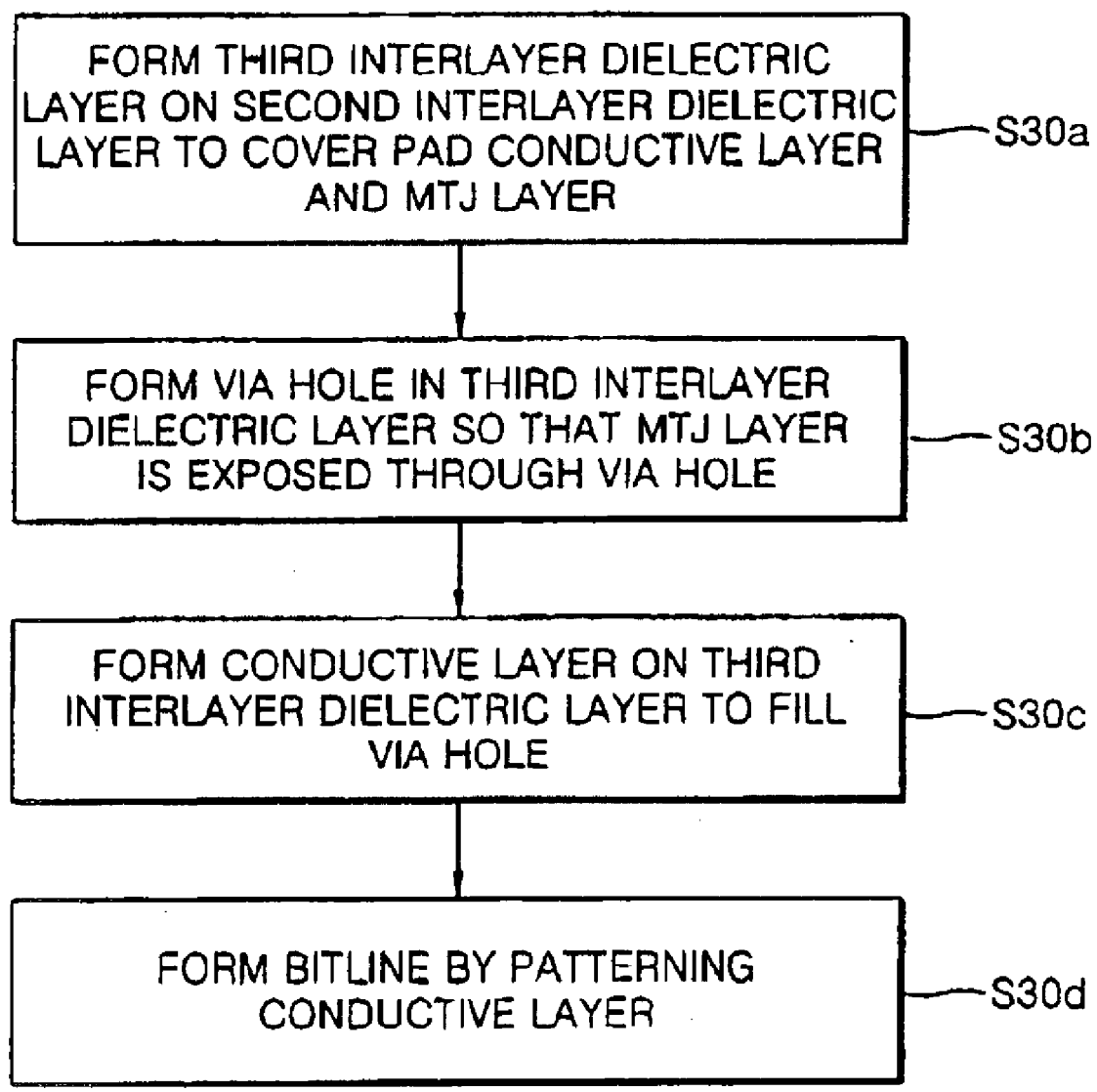

Referring to FIG. 7, step S30 includes forming a third interlayer dielectric layer on the second interlayer dielectric layer to cover the pad conductive layer and the MTJ layer in step S30a, forming a via hole in the third interlayer dielectric layer in step S30b so that the MTJ layer is exposed through the via hole, forming a conductive layer on the third interlayer dielectric layer to fill the via hole in step 30c, and forming a bit line by patterning the conductive layer to be perpendicular to the data line using photolithography in step S30d, so that the bit line is connected to the MTJ layer via the via hole.

Figure 8:
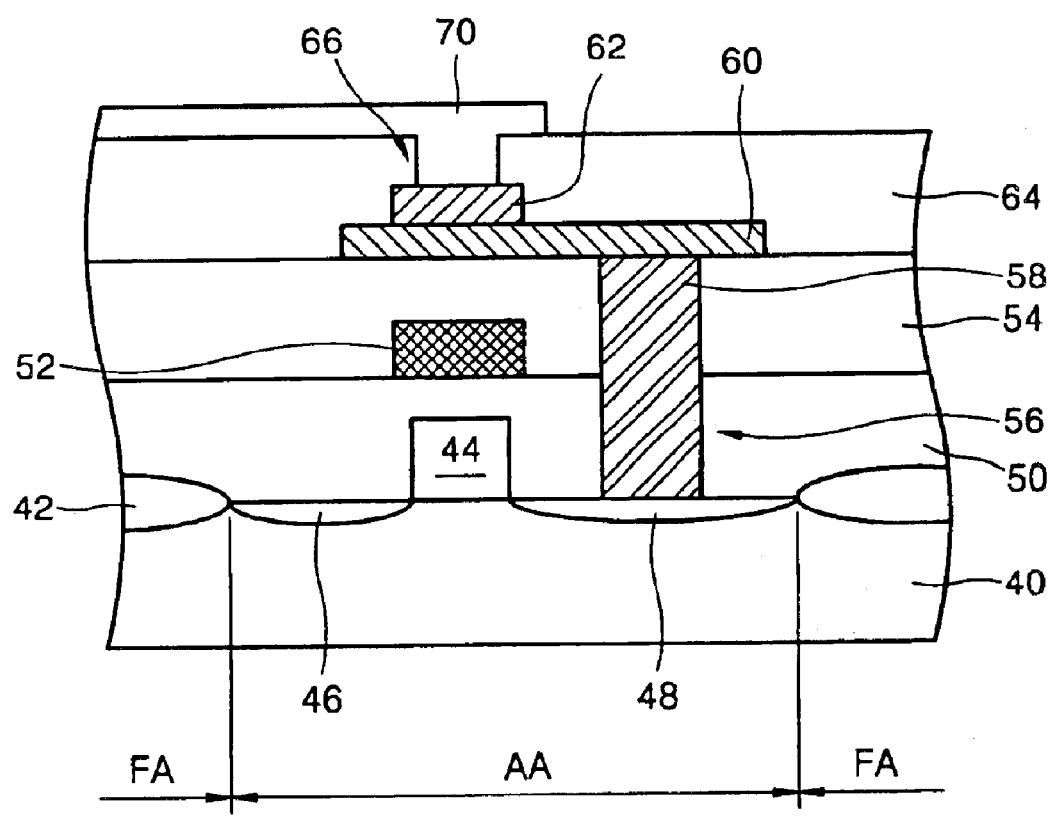
FIG. 8 illustrates a cross-sectional view of an MRAM manufactured in accordance with the detailed flowcharts of FIGS. 5 through 7.

FIG. 8 illustrates a cross-sectional view of an MRAM manufactured in accordance with steps S10, S20, and S30 of FIGS. 4 through 7. Referring to FIG. 8, an active area AA and field areas FA are defined on a semiconductor substrate 40, and field oxide layers 42 are respectively formed on the field areas FA. A transistor including a gate stack 44 and source and drain regions 46 and 48 is formed in the active area AA between the field oxide layers 42. In addition, a first interlayer dielectric layer 50 is formed on the semiconductor substrate 40 to cover the transistor, and a data line 52 is formed on the first interlayer dielectric layer to correspond to the gate stack 44.

The data line 52 is used to record data on an MTJ layer 62. When a predetermined current is applied to the data line 52, a magnetic field passing through the MTJ layer 62 is generated, and the transistor is turned off.

A second interlayer dielectric layer 54 is formed on the first interlayer dielectric layer 50 to cover the data line 52, and a contact hole 56 is formed through the first and second interlayer dielectric layers 50 and 54 at a predetermined distance away from the gate stack 44 so that the drain region 48 of the transistor is exposed through the contact hole 56. The contact hole 56 is completely filled with a conductive plug 58, and then a pad conductive layer 60 is formed on the second interlayer dielectric layer 54 so that the pad conductive layer 60 contacts a top surface of the conductive plug 58 and extends over the data line 52.

Figure 3:
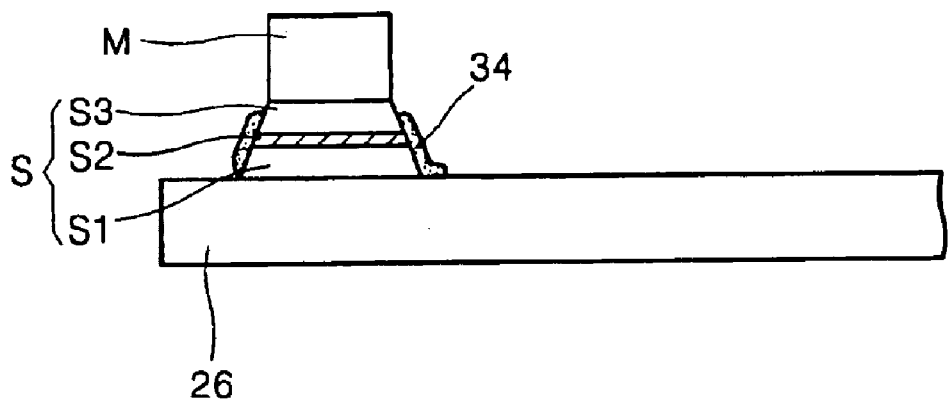

The MTJ layer 62 is formed on a predetermined region of the pad conductive layer 60 that corresponds to the data line 52. The profile of the MTJ layer 62 is much better than that of the MTJ layer S of FIG. 3 included in a conventional MRAM. In addition, the method of manufacturing an MRAM according to the present invention, unlike the prior art, does not generate undercuts on the MTJ layer 62 and does not cause any thermal damage to the MTJ layer 62.

A third interlayer dielectric layer 64 is formed on the second interlayer dielectric layer 54 to cover the pad conductive layer 60 and the MTJ layer 62, and a via hole 66 is formed through the third interlayer dielectric layer 64 so that the MTJ layer 62 is exposed. A bitline 70 is formed on the third interlayer dielectric layer 64 to fill the via hole 66 and to be connected to the MTJ layer 62. The bitline 70 is formed to be perpendicular to the data line 52 and the gate stack 44.

Figure 9:
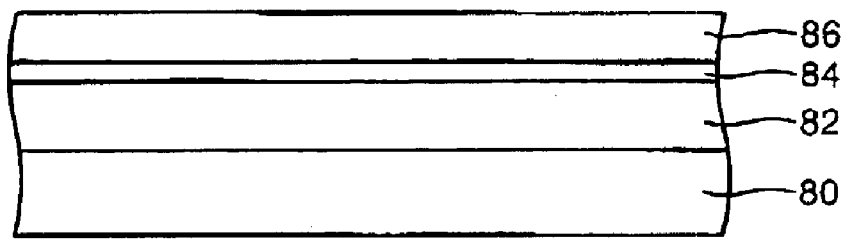
FIGS. 9 through 11 illustrate cross-sectional views showing a method of forming an MTJ layer of an MRAM according to a preferred embodiment of the present invention.
Figure 10:
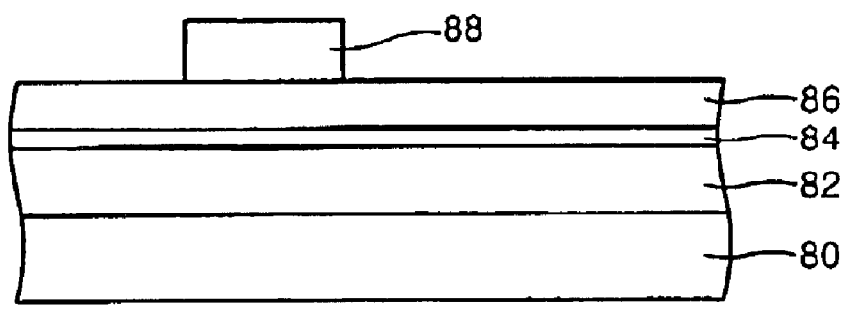
Figure 11:
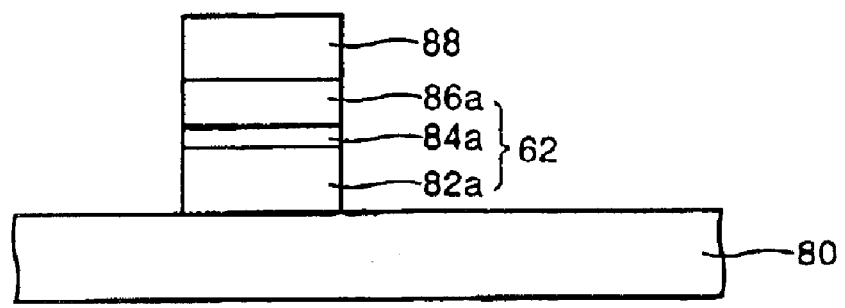

Step S20g, in which an MTJ layer is formed, involves three sub-steps. FIGS. 9 through 11 respectively illustrate cross-sectional views showing the three sub-steps of step S20g.

Figure 13:
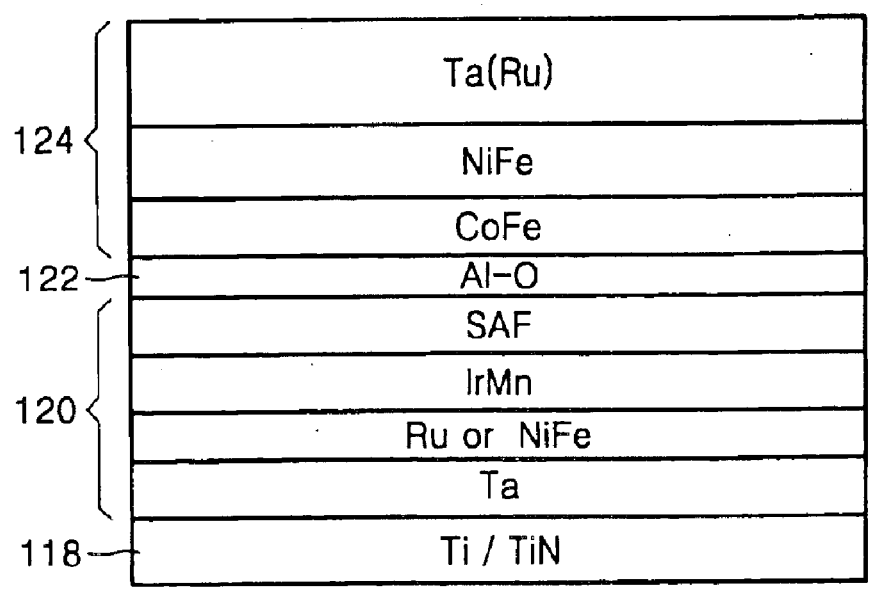
FIG. 13 illustrates a cross-sectional view of an MTJ layer formed by using a method of forming an MTJ layer for an MRAM according to a preferred embodiment of the present invention.

Referring to FIG. 9, in a first sub-step, a lower material layer 82, an insulation layer 84, and an upper material layer 86, which will constitute an MTJ layer later, are sequentially formed on a base substrate 80. The lower material layer 82 may be a single magnetic layer. Preferably, the lower material layer 82 is formed of a plurality of material layers including a magnetic layer. For example, as shown in FIG. 13, the plurality of material layers (120 in FIG. 13) may be formed by sequentially depositing a tantalum (Ta) layer, a ruthenium (Ru) layer, an iridium/manganese layer, and a synthetic anti-ferromagnetic (SAF) layer. Here, the ruthenium (Ru) layer may be replaced by a nickel iron (NiFe) layer. The insulation layer 84 is provided for electron tunnelling and is formed of, for example, an aluminium oxide ($Al_2O_3$) layer (122 of FIG. 13). The upper material layer 86 is preferably formed by sequentially depositing a magnetic layer and a capping layer. The magnetic layer may be formed as a single magnetic layer. However, as shown in FIG. 13, it is preferable to form the magnetic layer (bottom two layers of 124 in FIG. 13) by sequentially depositing, for example, a cobalt iron (CoFe) layer and a nickel iron (NiFe) layer. The capping layer (top layer of 124 in FIG. 13) is formed of a tantalum layer or a ruthenium layer. The base substrate 80 (118 in FIG. 13), on which the lower material layer 82 (120 in FIG. 13) is formed, may be formed of a single conductive material layer or a multi-layered conductive material layer. The multi-layered conductive material layer may be formed by sequentially depositing a titanium (Ti) layer and a titanium nitride (TiN) layer. The base substrate 80 corresponds to the pad conductive layer 60 of FIG. 8.

Referring to FIG. 10, in a second sub-step of step S20g, a mask pattern 88 is formed on the upper material layer 86 to cover a predetermined region thereof, which preferably corresponds to the data line 52 of FIG. 8, by performing photolithography using a predetermined exposure apparatus such as a KrF stepper. The mask pattern 88 is a photosensitive pattern smaller than micro size. For example, the mask pattern 88 may have a width of 0.4 µm and a length of 0.8 µm. The mask pattern 88 is directly transferred onto the underlying layers in a subsequent etching process. Therefore, an MTJ layer 62, which will be subsequently formed, should also be smaller than micro size.

Referring to FIG. 11, in a third sub-step, the upper material layer 86, the insulation layer 84, and the lower material layer 82 are sequentially etched using the mask pattern 88 as an etching mask, and then the mask pattern 88 is removed (not shown). Thus, the MTJ layer 62 in which a lower material layer pattern 82a, an insulation layer pattern 84a, and an upper material layer pattern 86a are sequentially stacked is completed.

Here, the upper material layer 86, the insulation layer 84, and the lower material layer 82 are sequentially etched using a predetermined plasma etching process. It is necessary to perform the etching process having different etching conditions for different material layers by independently adjusting a mixture ratio of a mixed gas used as an etching gas and a bias power applied to the base substrate 80.

The etching process performed on the three material layers 86, 84, and 82 will be described in greater detail in the following paragraphs.

Figure 12:
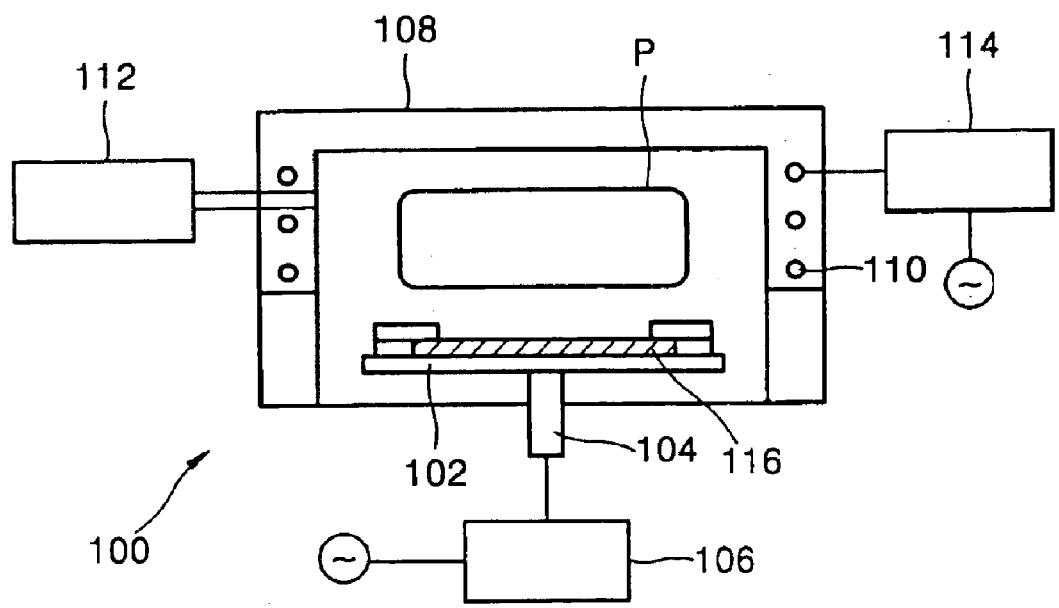
FIG. 12 illustrates a cross-sectional view of an inductively coupled plasma etching apparatus used to form an MTJ layer for an MRAM according to a preferred embodiment of the present invention.

FIG. 12 illustrates a cross-sectional view of an inductively coupled plasma etching apparatus 100 used to sequentially etch the upper material layer 86, the insulation layer 84, and the lower material layer 82. In FIG. 12, reference numeral 102 represents a stage on which a substrate is placed, reference numeral 104 represents a chuck supporting the stage 102, and reference numeral 106 represents a first radio-frequency (RF) matching unit connected to the chuck 104 to be capable of independently adjusting a predetermined bias power applied to the substrate loaded onto the stage 102. Reference numeral 108 represents a chamber where a plasma etching process is performed, reference numeral 110 represents a coil provided inside an upper wall of the chamber 108 to surround a space over the stage 102 inside the chamber 108, and reference numeral 112 represents an optical emission spectroscopy for checking every step of the plasma etching process being performed in the chamber 108. Light emitted through an optical emission window (not shown) provided at the chamber 108 is analysed by the optical emission spectroscopy 112. It is possible to determine, using the optical emission spectroscopy 112, which step of the etching process is being performed in the chamber 108 and what kinds of by-products are generated during the etching process. Reference numeral 114 represents a second RF matching unit for independently adjusting power applied to the coil 110. Helium gas (not shown) may flow inside the stage 102 to effectively transmit heat from the chuck 104 to the substrate loaded onto the stage 102.

When the lower material layer 82, the insulation layer 84, and the upper material layer 86 are sequentially etched in the inductively coupled plasma etching apparatus 100, the first RF matching unit 106 applies a bias voltage of 300 V or smaller, preferably, a bias voltage of about 100 V to about 150 V, to the substrate loaded onto the stage 102. The second RF matching unit 114 applies a source power of about 1.5 kW or smaller, preferably, a source power of about 500 W to about 800 W, to the coil 110. Due to the bias voltage applied by the first RF matching unit 106 and the source power applied by the second RF matching unit 114, plasma including ions, radicals, and electrons to be used in the etching process is generated in the space P over the stage 102 from a mixed etching gas uniformly injected into the chamber 108.

The sequential etching of the upper material layer 86, the insulation layer 84, and the lower material layer 82 to form an MTJ layer begins by loading the structure shown in FIG. 10 having the mask pattern 88 formed on the upper material layer 86 onto the stage 102. For convenience, an element represented by reference numeral 116 in FIG. 12 is considered to be the same as the structure of FIG. 10 having the mask pattern 88 formed on the upper material layer 86, which is loaded onto the stage 102. The structure 116 loaded onto the stage 102 is fixed onto the stage 102 by fixing elements provided on the stage 102 until the etching process for forming an MTJ layer is completed. After fixing the structure 116 of FIG. 10 onto the stage 102, a mixed etching gas is uniformly sprayed over the structure 116 of FIG. 10 through a nozzle (not shown) provided in a ceiling of the chamber 108. The mixed etching gas does not include chlorine ($Cl_2$) gas and is a mixture of a main gas and an additive gas having a predetermined mixture ratio. For example, boron trichloride ($BCl_3$) may be used as the main gas, and argon (Ar) may be used as the additive gas.

Boron trichloride is very effective for etching oxidized aluminium, i.e., the insulation layer 84, and for removing oxygen generated with the plasma inside the chamber 108. Due to the capability of boron trichloride to remove oxygen, as the amount of boron trichloride added to the mixed etching gas increases, the etching selectivity of the insulation layer 84 with respect to magnetic layers, i.e., the upper and lower material layers 86 and 82, increases. Therefore, it is possible to ultimately obtain an MTJ layer having a good profile. In other words, no by-products of the etching process are deposited on either sidewall of the MTJ layer, and the sidewalls of the MTJ layer have a perpendicular profile. In addition, corrosion of the MTJ layer due to etching gas remaining in the chamber after the etching process is completed may be prevented.

The etching of the three material layers 82, 84, and 86 may be optimized by adjusting a mixture ratio of the mixed etching gas and a main power applied to the inductively coupled plasma etching apparatus 100 to discharge the mixed etching gas, a bias power applied to the substrate loaded onto the stage 102, a temperature of the substrate, pressure, and gas flux.

For example, in a case in which boron trichloride and argon are used as the main gas and the additive gas, respectively, boron trichloride accounts for 60% or less, preferably about 10% to about 40%, of the mixed etching gas. In experimentation, the three material layers 82, 84, 86 were most effectively etched in both physical and chemical ways using the amount of boron trichloride mentioned above.

During the etching, the mixed etching gas is uniformly sprayed over the structure 116 of FIG. 10 through the nozzle (not shown) provided in the ceiling of the chamber 108, and a predetermined source power, for example, a source power of 500 W, is applied to the inductively coupled plasma etching apparatus 100, thereby generating plasma including radicals and ions from the mixed etching gas to be used to etch the three material layers 82, 84, and 86. The upper material layer 86 around the mask pattern 88 in the structure 116 of FIG. 10 is etched by the plasma, thereby exposing the insulation layer 84. Thereafter, the mixture ratio of the mixed etching gas is adjusted to be appropriate for etching the insulation layer 84 by varying the flow of gas injected into the chamber 108 via the nozzle (not shown). Then, plasma for etching the insulation layer 84 is generated using the mixed etching gas. Accordingly, the insulation layer 84 around the mask pattern 88 is etched by the plasma, and the lower material layer 82 is exposed. Thereafter, the mixture ratio of the mixed etching gas is adjusted again by varying the flow of gas injected into the chamber 108 via the nozzle (not shown) so that the mixed etching gas has a high etching selectivity with respect to magnetic layers. Thereafter, the lower material layer 82 around the mask pattern 88 is etched by plasma generated using the mixed etching gas. Thereafter, the mask pattern 88 is removed, thus completing the MTJ layer 62, in which a lower material layer pattern 82a, an insulation layer pattern 84a, and an upper material layer pattern 86a are sequentially stacked, as shown in FIG. 11.

In the case of using the inductively coupled plasma etching apparatus 100 and the above-described mixed etching gas in the etching process for forming the MTJ layer 62, the density of plasma used in the corresponding etching process, i.e., the density of radicals and ions, may be increased. Therefore, the plasma is further activated so that by-products of an etching process performed at temperatures below 100° C., preferably, at a temperature of about 25° C., have volatile characteristics.

The etching process for forming the MTJ layer 62 is not a high temperature process performed at temperatures that are several hundreds of degrees centigrade, but a low temperature process performed at a temperature of about 25° C. Therefore, thermal damage to the MTJ layer 62 can be prevented during the etching process. In addition, as described above, since the by-products generated in the low temperature process are volatile, they can be prevented from being deposited on the MTJ layer 62. Accordingly, the profile of the MTJ layer 62 becomes better than that of an MTJ layer formed in a conventional manner.

FIG. 13 illustrates a cross-sectional view of the MTJ layer 62 formed through the above-described etching process. In FIG. 13, reference numerals 118, 120, 122, and 124 represent a substrate, a lower material layer including a magnetic layer, an insulation layer, and an upper material layer including a magnetic layer, respectively.

In view of productivity, it is preferable to etch the upper material layer 124, the insulation layer 122, and the lower material layer 120 at the same time. However, the etching of the three material layers 120, 122, 124 may be performed in two, three or more steps.

For example, in a case of etching the MTJ layer 62 in two steps, the upper material layer 124 is etched in a first step. Thereafter, in a second step, the mixture ratio of the mixed etching gas is adjusted appropriately for etching of the insulation layer 122 and the lower material layer 120, and then the insulation layer 122 and the lower material layer 120 are consecutively etched.

In the case of etching the MTJ layer 62 in three steps, the upper material layer 124 is etched in a first step, and then the insulation layer 122 is etched in a second step. Thereafter, in a third step, the lower material layer 120 is etched. Here, in each of the second and third steps, the mixture ratio of the mixed etching gas is adjusted so that the mixed etching gas has a mixture ratio appropriate for etching the corresponding layer.

In the case of etching the MTJ layer 62 in more than three steps, an etching process may be performed as many times as a number of material layers constituting the MTJ layer 62, and varying the mixture ratio of the mixed etching gas in each of the steps.

Figure 14:
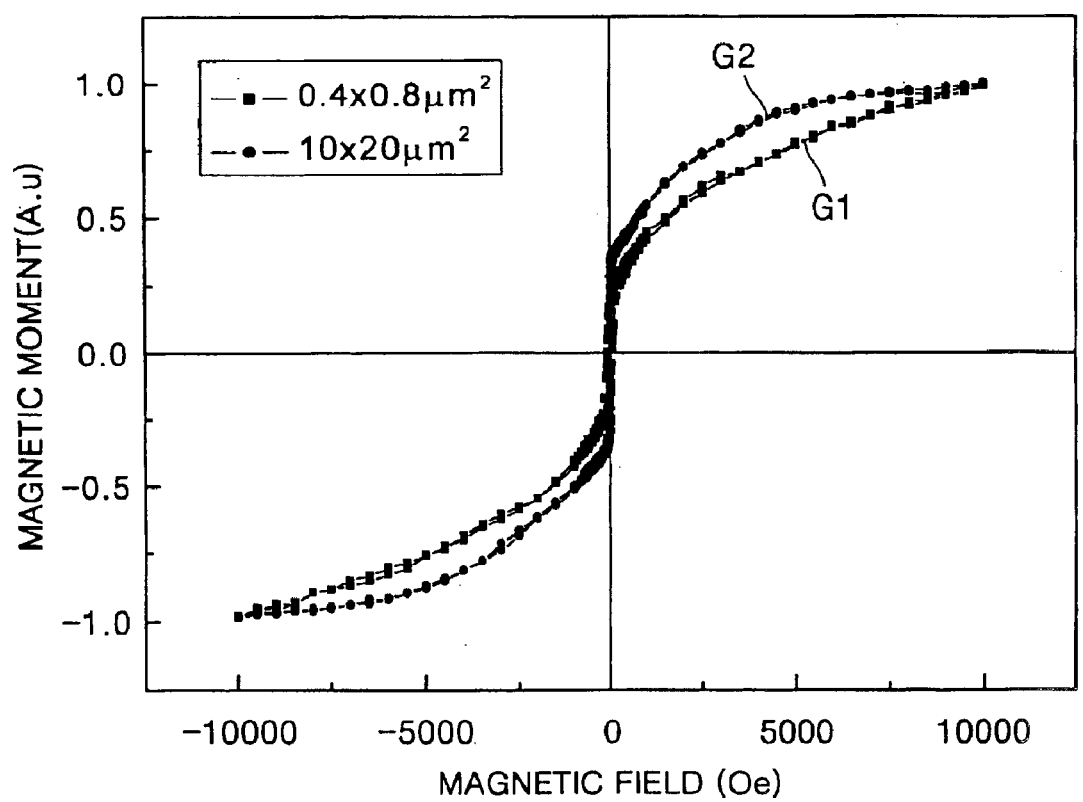
FIG. 14 is a graph for comparing hysteretic characteristics of an MTJ layer smaller than micro size formed by a method of forming an MTJ layer for an MRAM according to a preferred embodiment of the present invention with hysteretic characteristics of an MTJ layer larger than micro size formed by using a conventional method of manufacturing an MRAM.

FIG. 14 is a graph for comparing the hysteretic characteristics of an MTJ layer (hereinafter, referred to as a first MTJ layer) smaller than micro size, for example, having dimensions of 0.4 $\mu$m×0.8 $\mu$m, formed by a method of forming an MTJ layer of an MRAM according to a preferred embodiment of the present invention with the hysteretic characteristics of an MTJ layer (hereinafter, referred to as a second MTJ layer) larger than micro size formed by a conventional method of manufacturing an MRAM. Here, the hysteretic characteristics of the first and second MTJ layers are measured using a vibrating sample magnetometer (VSM), which is a magnetism measurement apparatus. A first curve G1 shows the hysteretic characteristics of the first MTJ layer, and a second curve G2 shows the hysteretic characteristics of the second MTJ layer.

The first and second curves G1 and G2 of FIG. 14 do not show any significant difference in hysteretic characteristics between the first MTJ layer and the second MTJ layer. Therefore, even though the MTJ layer manufactured according to the present invention is smaller than micro size, it has almost the same hysteretic characteristics as the conventional MTJ layer that is larger than micro size.

As described above, an etching process in the method of forming an MTJ layer of an MRAM according to the present invention is performed in an inductively coupled plasma etching apparatus. As the etching process begins, a main gas such as boron trichloride ($BCl_3$) and an additive gas such as argon (Ar) are mixed together to have an optimum mixture ratio, and then the mixed gas is uniformly supplied into the inductively coupled plasma etching apparatus so as to generate etching plasma. Accordingly, the density of plasma generated in the inductively coupled plasma etching apparatus, i.e., the density of ions and radicals to be used in the etching process, increases, and thus the etching process can be performed at temperatures lower than 100° C., for example, at a temperature of 25° C. Therefore, it is possible to prevent any thermal damage to an MTJ layer during the etching process. In addition, since the plasma generated according to the present invention is activated more than plasma generated in the prior art, by-products of the etching process of the present invention are volatile. Therefore, it is possible to prevent the by-products from being deposited on the MTJ layer, and thus the sides of the MTJ layer are clean and almost perpendicular. Accordingly, the profile of the MTJ layer manufactured by the present invention is much better than its conventional counterpart. In addition, since chlorine ($Cl_2$) gas is not used as an etching gas in the present invention, generation of a step difference at either side of the MTJ layer and corrosion of the MTJ layer can be prevented. Moreover, by the method of forming an MTJ layer of an MRAM according to the present invention and the advantages provided thereby, it is now possible to manufacture an MTJ layer that is smaller than micro size without any physical or chemical damage to the MTJ layer.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, argon gas, which has been mentioned herein as an additive gas included in an etching gas, may be replaced by another gas, and a proportion of the etching gas that is the main gas may be varied. In addition, any of a lower material layer, an insulation layer, and an upper material layer may be formed of different materials than those set forth herein.

What is claimed is:

1. A method of manufacturing a magnetic tunneling junction (MTJ) layer for a magnetic random access memory (MRAM), comprising:

sequentially forming a lower material layer, an insulation layer, and an upper material layer on a substrate;

forming a mask pattern on a predetermined region of the upper material layer;

sequentially removing the upper material layer, the insulation layer, and the lower material layer from around the mask pattern using plasma generated from an etching gas, wherein the etching gas is a mixture of a main gas and an additive gas having a predetermined mixture ratio and including no chlorine ($Cl_2$) gas; and removing the mask pattern.

2. The method as claimed in claim 1, wherein sequentially removing the upper material layer, the insulation layer, and the lower material layer from around the mask pattern, comprises:

loading a resultant structure having the mask pattern formed on the predetermined region of the upper material layer into an inductively coupled plasma etching apparatus; and generating plasma over the resultant structure by uniformly supplying the etching gas into the inductively coupled plasma etching apparatus and applying a predetermined source power and a predetermined bias voltage to the inductively coupled plasma etching apparatus.

3. The method as claimed in claim 1, wherein about 10% to about 40% of the etching gas is comprised of the main gas.

4. The method as claimed in claim 1, wherein the main gas is boron trichloride ($BCl_3$), and the additive gas is argon (Ar).

5. The method as claimed in claim 2, wherein a source power of from about 500 W to about 800 W is applied to the inductively coupled plasma etching apparatus.

6. The method as claimed in claim 2, wherein a bias voltage of from about 100 V to about 150 V is applied to the inductively coupled plasma etching apparatus.

7. The method as claimed in claim 1, wherein the upper material layer, the insulation layer, and the lower material layer are removed from around the mask pattern at a temperature of about 25° C.

8. The method as claimed in claim 1, wherein at least one of the lower material layer and the upper material layer is a single magnetic layer or a multilayered material layer including at least one magnetic layer.

9. The method as claimed in claim 1, wherein the mask pattern is formed to be smaller than micro size.

10. The method as claimed in claim 1, wherein sequentially removing the upper material layer, the insulation layer, and the lower material layer from around the mask pattern comprises:

first removing the upper material layer and the insulation layer from around the mask pattern; and then removing the lower material layer from around the mask pattern.

11. The method as claimed in claim 10, wherein before removing the lower material layer, the etching gas is adjusted to be comprised of from about 10% to about 40% main gas in accordance with etching characteristics of the lower material layer to facilitate etching of the lower material layer.

12. The method as claimed in claim 1, wherein sequentially removing the upper material layer, the insulation layer, and the lower material layer from around the mask pattern comprises:

first removing the upper material layer from around the mask pattern;

then removing the insulation layer from around the mask pattern; and then removing the lower material layer from around the mask pattern.

13. The method as claimed in claim 12, wherein before removing each of the insulation layer and the lower material layer, the etching gas is adjusted to be comprised of from about 10% to about 40% main gas in accordance with etching characteristics of the insulation layer and the lower material layer to facilitate etching of the insulation layer and the lower material layer.

14. The method as claimed in claim 1, wherein sequentially removing the upper material layer, the insulation layer, and the lower material layer from around the mask pattern comprises:

first removing the upper material layer from around the mask pattern; and then removing the insulation layer and the lower material layer from around the mask pattern.

15. The method as claimed in claim 14, wherein before removing the insulation layer and the lower material layer from around the mask pattern, the etching gas is adjusted to be comprised of from about 10% to about 40% main gas in accordance with etching characteristics of the insulation layer and the lower material layer to facilitate etching of the insulation layer and the lower material layer.

16. The method as claimed in claim 1, wherein the substrate is formed by sequentially depositing a titanium (Ti) layer and a titanium nitride (TiN) layer.

* * * * *